United States Patent [19]

Raykhtsaum et al.

[11] Patent Number: 5,139,883
[45] Date of Patent: Aug. 18, 1992

[54] INTERMETALLIC TIME-TEMPERATURE INTEGRATION FUSE

[76] Inventors: Grigory Raykhtsaum, 22 Chestnut Pl. #409, Brookline, Mass. 02146; Dwarika P. Agarwal, Stonehedge La., Attleboro, Mass. 02703; James R. Valentine, 166 Woburn St., Reading, Mass. 01867; David J. Kinneberg, 8 Claire Dr., Attleboro, Mass. 02703

[21] Appl. No.: 349,538

[22] Filed: May 9, 1989

[51] Int. Cl.⁵ .............................. B32B 15/02
[52] U.S. Cl. ............................ 428/573; 428/607; 428/615; 428/642; 428/643; 428/670; 428/672; 428/673; 428/674; 428/941
[58] Field of Search ........... 337/290, 416; 428/607, 428/642, 573, 643, 644, 645, 646, 647, 615, 669, 670, 671, 672, 673, 674, 941

[56] References Cited

U.S. PATENT DOCUMENTS

| | | | |
|---|---|---|---|
| 1,008,970 | 11/1911 | Kessler | 428/607 |
| 2,438,967 | 4/1948 | Ellsworth | 428/607 |
| 2,900,708 | 8/1959 | Pond | 428/607 |
| 3,177,054 | 4/1965 | Moriguchi | 428/607 |
| 3,181,935 | 5/1965 | Coad | 428/607 |
| 3,382,054 | 5/1968 | Coad | 428/607 |
| 3,492,545 | 1/1970 | Meyerhoff | 428/607 |
| 3,555,365 | 1/1971 | Forlani et al. | 337/290 |
| 3,810,287 | 5/1974 | Pryor et al. | 428/607 |
| 3,838,376 | 9/1974 | Norholm | 337/290 |
| 4,042,950 | 8/1977 | Price | 337/290 |
| 4,355,082 | 10/1982 | Bischoff et al. | 428/607 |

FOREIGN PATENT DOCUMENTS

| | | | |
|---|---|---|---|
| 128261 | 12/1984 | European Pat. Off. | 337/416 |
| 3804916 | 10/1988 | Fed. Rep. of Germany | 337/416 |
| 55-151710 | 11/1980 | Japan | 428/607 |
| 56-114240 | 9/1981 | Japan | 337/416 |
| 57-29815 | 6/1982 | Japan | 337/416 |
| 2189096A | 10/1987 | United Kingdom | 337/416 |

*Primary Examiner*—John J. Zimmerman

[57] ABSTRACT

Gold, copper, silver, palladium or aluminum and their alloys, but preferably gold or gold alloy, which may be in the form of a wire, has deposited thereon or contained within the wire, a material such as metals or metal alloys which diffuse into the gold or into the other listed metals. With the passage of time and exposure to temperature the deposited metal or metal alloy continues to diffuse into the gold forming intermetallics with the gold and thereby causing the resistivity of the gold to increase and causing the gold to become progressively more brittle until such time as the gold wire ruptures at a stress point. At a given temperature, the elapsed time until rupture takes place depends upon the metal or metal alloys deposited on or contained within the gold. Lead, indium, gallium, tin, bismuth and aluminum and the alloys of these metals diffuse into and form intermetallics with the gold. The time rate of embrittlement of the gold and the other soft metals listed is a function of the metal or metal alloy and the temperature. Gold wires so treated with the metal or metal alloys may be used as time temperature dependent fuses. For example such fuses may be useful for the protection of integrated circuits or systems of integrated circuits wherein the gold wires so treated are used as connections within the circuit or system.

3 Claims, 7 Drawing Sheets

INTERMETALLIC TIME-TEMPERATURE INTEGRATION FUSE

BACKGROUND OF THE INVENTION

1. Field of the Invention

The present invention relates most generally to treated gold or gold alloys and to copper, silver, palladium, aluminum and their alloys all of which becomes increasingly brittle with the accumulation of, or the integration of, time and temperature. More particularly, the present invention is directed to providing a means for the time temperature fusing of, or the protecting of, electrical or electronic systems by causing the mechanical or electrical rupture (resistivity increase) of a connecting wire of, for example, gold due to the increasing, with time and temperature, of the brittleness of the wire until such time as the resistivity increases to a predetermined value or until the wire breaks at a stress point in the wire.

2. Description of the Prior Art

There has been, and currently exists, a need to provide for the protection of both electronic and electrical circuits. In many circumstances it is desirable to disable a circuit system after it has been exposed to a specified temperature for a specified period of time. In order to provide this type of protection, or fusing, a temperature sensor such as a probe, a means for measuring elapsed time, a means for providing the product of time and temperature must be provided. Then these products of time and temperature must be accumulated. Finally when the critical value, or a threshold, is reached the threshold must be detected and a circuit disconnect must be caused to take place.

With the development of large scale integration techniques and the use of large numbers of integrated circuits within an electronic system, if it is desired to provide time temperature fusing of each integrated circuit or a portion of the integrated circuits within the system, it would be necessary to incorporate, at considerable expense, the time temperature integrator fusing system that has just been described. Alternatively it may be possible where the numbers of circuits permit, to use one or several time temperature integrator fuse systems and time-scan or time-share over the circuits which need to be protected. This approach is not one which holds great value for many obvious reasons. The number of circuits that can be time-shared would have to be minimal in number so that the time lapse between the time when a first circuit was being tested or examined for time temperature exposure to the time this circuit is again being examined for time temperature exposure must be within a reasonable period of time. Further, the temperature and time for each circuit would all have to be substantially equal to each other. Quite simply, there presently exists no economically nor technically feasible way to provide for time temperature integration fusing of a plurality of, for example, integrated circuits.

Given that there is specific concern for the time temperature fusing or the deactivating of integrated circuits upon the accumulated exposure to time and temperature of the integrated circuits, consideration was given to using the gold bonding wires, which are used to connect the integrated circuit to pins. These pins may be used to mount the integrated circuit or collection of interconnected integrated circuits to the rest of the electronic system. If a bonding wire could be modified or altered in such a way that with the integration of time and temperature the wire would physically break or the resistivity of the wire could be sufficiently increased, then the circuit associated with that particular gold bonding wire could be made nonfunctional or nonoperative. Providing a means for promoting a chemical reaction with the gold wire appeared, at first pass, to be a possible approach to be used to cause a change in either the physical or electrical characteristics of the gold wire. The difficulties associated with such an approach were recognized very early in the process of developing such a technology. For example, it is known that cyanides and iodides will react with the gold to form gold salts but these solutions are very active and produce vapors which are harmful and also react much too rapidly with gold. In addition, the quantities of solutions needed are very large, approaching 20 times the volume of the wire.

It was recognized by applicants herein that since gold is relatively soft (as is copper, silver, palladium and aluminum) it may be useful to consider changing the gold wire or other soft metal wire from being soft to being brittle and thereby effect the resistivity and physical properties. It was desired that these alterations in the properties of the gold or other soft metal wire be a function of elapsed time and also of the temperature. It is well known that intermetallics are brittle by nature. If, for example, a gold wire could be treated in a proper manner and using appropriate materials so that an intermetallic compound with the gold would be formed, then with time and temperature the material which forms an intermetallic with gold would diffuse into the gold wire from the surface by either a homogeneous diffusion or by diffusion along the grain boundaries (the rate of diffusion being dependent upon the temperature and also the length of time that diffusion takes place as well as the metal or metal alloy deposited onto or contained within the wire) the gold wire would progressively become intermetallic across the entire cross section of the wire and consequently more brittle and would break at a stress point or at stress points rendering nonfunctional a device or a system which uses the wire as an essential element. Alternatively the resistivity of the wire would be increased to such an extent as to render the circuit connected to the integrated circuit (IC) pins by the gold wire nonfunctional.

It is virtually always the case, for any number of reasons, that gold is used to plate over other metals. Presently there is no useful purpose known for plating over gold with a metal which will embrittle the gold. In fact it is very unconventional to cover over, deposit, or plate over gold, silver or palladium for any known reason or for any known useful purpose. In the integrated circuit industry, where gold wires are preferred, it is considered essential that the gold bonding wires be as pure as is possible. In complete opposition to conventional teaching and wisdom, in the instant invention pure gold has deposited on it a metal or an alloy of metals which will, with time and temperature, homogeneously diffuse into the gold or diffuse by way of the grain boundaries into the gold, which may be in the form of a wire, and create intermetallics which progress across the cross section of the gold wire or which diffuse into the grain boundaries and create intermetallics within the grain boundaries. In either case the gold wire becomes embrittled—the degree of brittleness increasing with time and temperature until the gold wire either physically breaks/ruptures or the resistivity of the wire increases to a level at which the circuit fails to function properly.

With proper selection of the intermetallic producing metals and/or alloys of such metals, (the intermetallics being formed with the soft metal or a soft metal alloy wire, substrate, ribbon or other geometric form of the soft metal or soft metal alloy) the time temperature fuse can be tailored to fail physically or electrically upon reaching a particular threshold value of integrated time and temperature. For example, gallium will diffuse rapidly into gold, create intermetallics and cause the embrittlement of the wire at relatively low temperatures. On the other hand, aluminum diffuses very slowly into the gold and thus it takes a considerably longer period of time for the gold to become embrittled and to reach the point of embrittlement where either the resistance of the gold wire increases to a level such that the circuit fails to operate or the wire becomes so embrittled that it physically breaks at a stress point.

In summary the invention can be described most generally as being soft metal or a soft metal alloy having deposited thereon, or contained within, a metal or a metal alloy which, as a function of time and temperature, homogeneously diffuses into and creates an intermetallic with the soft metal or soft metal alloy and thus embrittling the soft metal or soft metal alloy. Alternative to or simultaneously with homogeneous diffusion, grain boundary diffusion may occur; that is, diffusion along the grain boundaries creating an intermetallic within the grain boundaries and thereby embrittling the soft metal or its alloy.

It is a primary object of the invention to provide a composition of matter comprising a soft metal such as gold and at least one metal such as lead, indium, mercury, gallium, tin, bismuth and aluminum and the alloys of these metals which will diffuse into the gold thereby causing the embrittlement of the gold.

Another primary object of the invention is to provide a composition of matter comprising a soft metal alloy such as a gold alloy having a predetermined resistivity and having deposited thereon a material or metal alloy which will diffuse into the gold alloy or diffuse into the alloy along grain boundaries of the alloy thereby embrittling the alloy the embrittlement being a function of diffusion time and diffusion temperature.

Another object of the invention is to provide a method for causing the function interruption or the disfunction of an electronic or electrical circuit configuration where the disfunction takes place upon the accumulation of, or the integration of, time and temperature.

Yet another object of the invention is to provide a method for causing circuit disfunction dependent upon time and temperature and wherein the circuit disfunction is caused by the mechanical breaking or by the increase in resistivity of a soft metal wire such as a gold or gold alloy interconnecting wire within the circuit system and which breaking or increase in resistivity is caused by the embrittlement of the gold interconnecting wire with time and temperature exposure.

A still further object of the invention is to provide a method for causing the time temperature dependence embrittlement of a soft metal or an alloy of the soft metal such as gold or gold alloy due to the homogeneous diffusion or the grain boundary diffusion of metals or metal alloys which form intermetallics with gold or which form intermetallics throughout grain boundaries of the gold or gold alloy.

DESCRIPTION OF THE PREFERRED EMBODIMENTS

Figure 1:
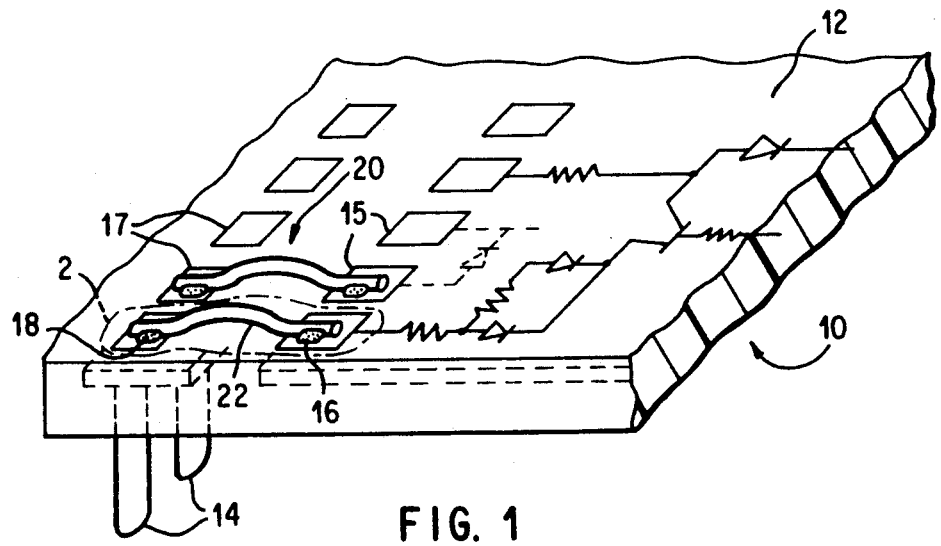
FIG. 1 is a pictorial representation of the use of gold bonding wires for interconnection in general and in particular, to connect from the pins of the integrated circuit package to the integrated circuit substrate itself.
Figure 2:
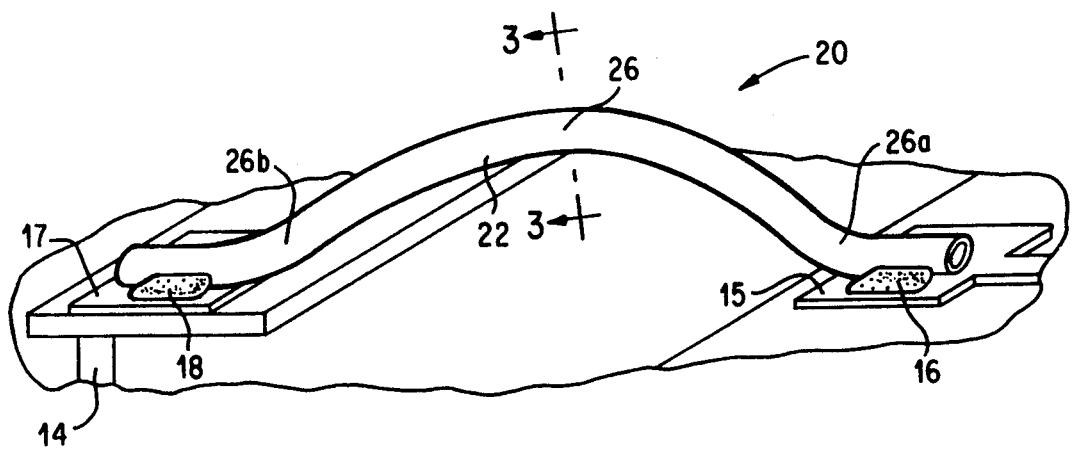
FIG. 2 is a perspective view of the time temperature integrator fuse embodied as a gold bonding wire in an integrated circuit package.
Figure 3A:
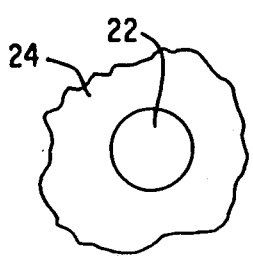
FIG. 3A is a cross section taken along line 3—3 of FIG. 2 and which pictorially illustrates the grains and the grain boundaries prior to any substantial diffusion.
Figure 3B:
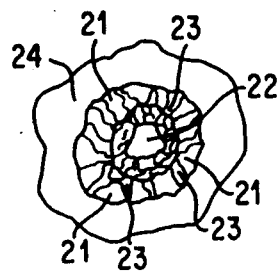
FIG. 3B pictorially illustrates changes in the grains and grain boundaries which have taken place as a result of the diffusion of the metal.
Figure 3C:
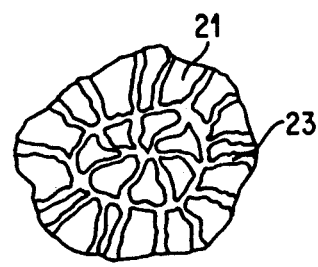
FIG. 3C pictorially illustrates the gold wire in an advanced stage of embrittlement.

Throughout the description of the invention, gold and alloys of gold will typically be used to explain and illustrate features of the invention. What is taught relative to gold and alloys of gold applies to the other listed soft metals of copper, silver, palladium and aluminum and their alloys.

The invention disclosed herein is most generally the concept of "poisoning" or otherwise making articles of a soft metal (gold, copper, silver, palladium and aluminum) and/or alloys of such soft metals less pure using a material which diffuses into the soft metal or soft metal alloy creating intermetallic compounds with the soft metal. The intermetallic compound may form in a homogeneous fashion throughout the cross section of an article of, e.g., gold or the intermetallic may form within the grain boundaries of the gold. The formation of the intermetallic by any means results in embrittling the gold and/or gold alloy. This concept of providing for the "poisoning" of, for example, gold so as to result in the gold becoming increasingly brittle due to the ongoing formation, with time and temperature, of intermetallics has, at least, application to the protection of electrical and electronic circuits and/or systems against excessive exposure or exposure beyond a predetermined critical or threshold amount to the accumulation of time and temperature.

It is understood that there are many types of circuits and systems which are, or need to be, protected against such time-temperature exposure. It is certainly not intended to define those types of systems. Where a gold or gold alloy wire, ribbon or article of other cross sectional configuration can be used to provide necessary electrical energy or needed information in the form of electrical signals in order for the circuit or system to function, such a wire can be of the type and nature disclosed herein and produced in accordance with the methods of this invention.

While the phenomenon of intermetallic formation is well known, the utilizing of the phenomenon associated with intermetallics for fusing is completely new as is the choice of appropriate materials to accomplish the fusing objectives. There are metals, and metal alloys which will diffuse into gold and gold alloys and form intermetallics with the gold which intermetallics thus formed are very brittle. It has been found that the rate of diffusion, which depends upon the temperature of the article of gold and the metal or combination of metals deposited onto or contained within the gold or gold alloy article, can be used to effect a fusing function. With the appropriate selection of materials, the gold or gold alloy will become so embrittled as to break of its own weight in a specified amount of accumulated time and temperature and if such material was used in the situation of fusing a circuit the circuit could be and indeed would be disabled i.e., disconnected in the same manner as a fuse. Thus, a soft gold article such as a wire or ribbon poisoned with a metal such as lead will become, with the accumulation of time and temperature, so embrittled so as to break or fracture at any existing stress point. If the article was, for example, attached at both ends of the wire and the wire was otherwise unsupported, it would with the passage of time and exposure to temperature, fracture. It is important to note that it is the combination of time and temperature which will ultimately lead to the fracture of the wire or ribbon. At lower temperatures, for a given material, a longer time is needed for diffusion to take place and the intermetallics to form and embrittle the wire or ribbon. Given the same material at higher temperature, a shorter period of time is needed to reach the degree of embrittlement which will result in the fracture of the wire.

When a wire or ribbon, or other article having a different cross section geometry is so treated with metals which will diffuse and form intermetallics with the gold, is used as a time-temperature integrator fusing device, the system may be caused to fail not only as a result of the physical breaking of a wire connection but also because of the increase in the resistivity of the connecting wire. Thus with an appropriate choice of materials failure will result due to the increase in the resistivity, with time and temperature, beyond the designed threshold for the circuit or system.

Recognizing that there are many variables which can be used in order to meet specific time-temperature failure objectives and that there are many combinations of the materials which will poison the gold, all of which will have different diffusion rates as functions of temperature, the invention necessarily must be described in detail for a very limited number of such combinations. It should also be recognized that stress points or regions of stress can be placed within the wire or ribbon etc., which may vary in the degree of stress and thus would also be a factor which would affect the time-temperature threshold value; that is, the value of accumulated time and temperature at which failure due to fracture or high resistivity takes place.

The article may also be made from a plurality of soft metal segments in end-to-end connection whereby each soft metal wire segment has in predetermined length having deposited thereon, or contained within, a metal or metal alloy which diffuses into or diffuses throughout the soft metal. The metal or metal alloy causes a controlled time temperature embrittlement of the soft metal wire segments.

Applicant wishes to further point out that there are many known ways to deposit metals onto metals. Such methods are not being claimed as a part of the invention. Where Applicant discusses or teaches the deposition of a metal such as lead onto a pure gold bonding wire, such deposition may be accomplished by any of the known methods such as electro or electroless plating, physical vapor deposition, plating from a melt etc.

So as not to becloud the relative simplicity of the invention, with reference to FIGS. 1-3A, 3B and 3C the time-temperature fuse 20 will be described primarily as being a gold bonding wire 22 i.e. an article of gold having defined length and a cross section which is, in this instance, shown to be circular and is frequently used in integrated circuit technology to connect the integrated circuit substrate 12 to the connector pins 14 of the integrated circuit package. The wire 22 is treated by having deposited on it a layer of material 24 such as lead. When the wire 22 is so treated it may then be used as the time-temperature fuse 20 when it is connected at the ends by bond joints (or by other low resistivity connecting means) 16 and 18 to the Integrated circuit land and the pin land 15 and 17 respectively. There is usually provided at least one stress region 26 which is created by arching the wire from one joint 16 to the other joint 18. It should be noted that stress regions 26a and 26b also exist at the joints 16 and 18. At least one time-temperature fuse 20 is shown connecting the integrated circuit substrate 12 of the package or system 10 to at least one of the connector pins 24.

After treating the wire 22 with material 24, with the accumulation of time and temperature, material 24 diffuses into the gold wire 22. If lead is the material 24 intermetallics such as $AuPb_2$ and $Au_2Pb$ are formed. The diffusion takes place by either homogeneous diffusion or by diffusion along grain boundaries 23 causing an intermetallic to form. Whether diffusion is by homogeneous diffusion or by grain boundary diffusion, the intermetallics thus formed are brittle and result in the embrittlement over time of the gold wire 22. With time and temperature the designed critical or threshold value of resistivity is reached and the circuit fails or the fuse 20 ruptures or breaks at one of the stress regions 26, 26a or 26b. The change in the microstructure of the wire is pictorially illustrated in FIGS. 3A–3C.

As an illustration of the making of a fuse 20 and of the performance of a fuse 20, a gold wire is coated with lead and then subjected to heat whereby a diffusion reaction takes place (see FIG. 10B) which results in the formation of the intermetallic compounds $AuPb_2$ and $Au_2Pb$. The resulting wire is composed entirely of the above intermetallic compounds and contains about 70 wt. percent Pb and 30 wt. percent Au.

The following examples show how one can vary parameters of such a fuse by selecting different materials to form intermetallics with gold.

EXAMPLE 1 GOLD—LEAD SYSTEM

Figure 4:
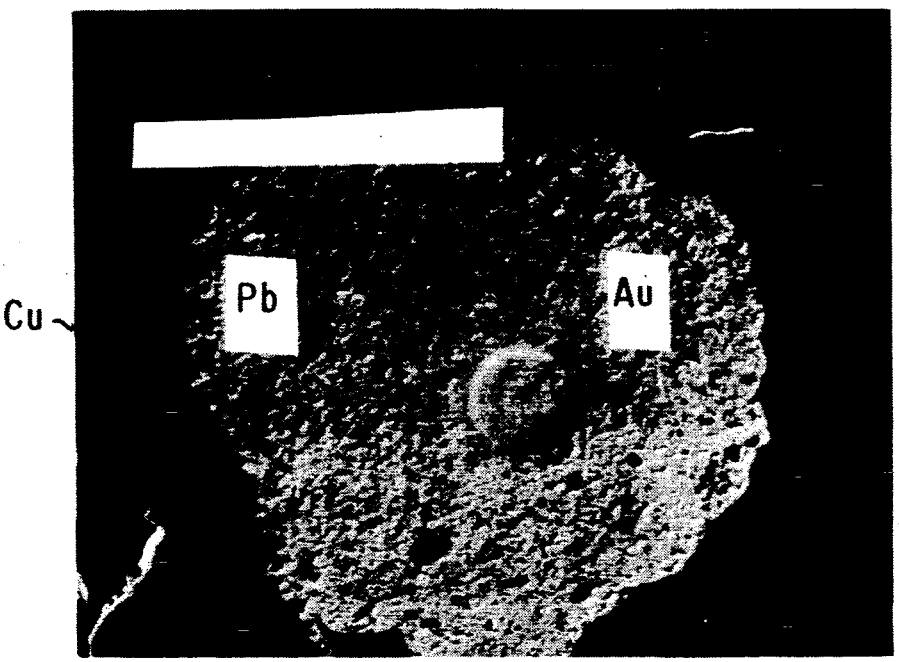
FIG. 4 is a copy of a photograph showing the cross-section of a 30 micron diameter gold wire having lead electroplated on the surface of the gold and copper plated over the lead.
Figure 5:
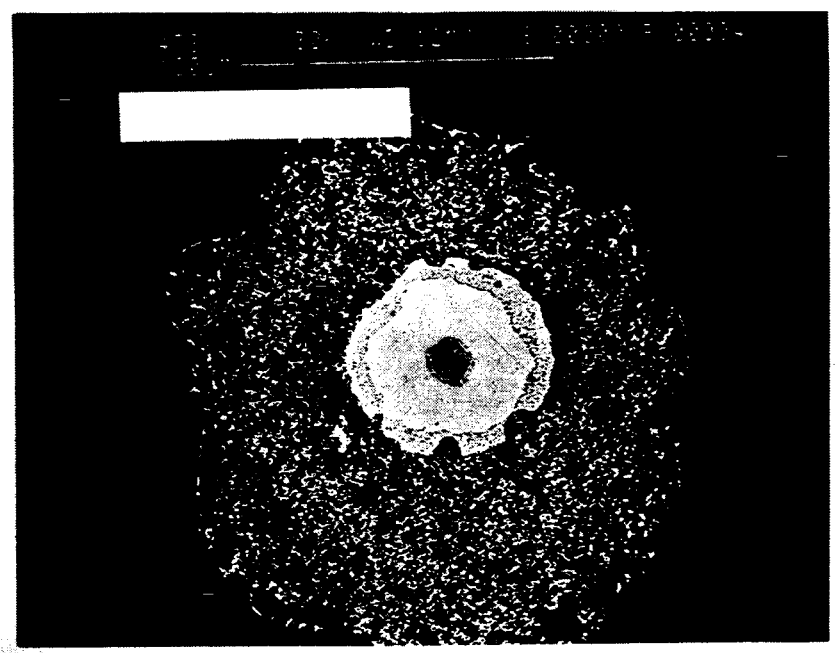
FIG. 5 is a copy of a photograph showing the cross-section of the 30 micron diameter gold wire of FIG. 4 after 13 days at 100° C.

To study the diffusion process, lead was electroplated on a 30 micron (1.2 mil.) diameter gold wire. FIG. 4 shows the cross-section of such wire under 438× magnification. Copper was plated on the top of the lead layer to prevent distortion of lead and gold during metallographic polishing and examination. Copper plating is used only for microscopic examination. The wire was placed in the oven and kept there at temperature of 100° C. FIG. 5 shows the cross section of the wire under 438× magnification after 13 days in the oven. It is seen that there is a wide area of diffusion zone between the lead and gold.

Figure 6:
FIG. 6 is a copy of a photograph showing a 30 micron diameter gold wire similar to that of FIG. 4 but without the copper plate after 57 days at 100° C.
Figure 7:
FIG. 7 is a copy of a photograph showing the cross-section of the fracture surface of the 30 micron diameter gold wire of FIG. 6 after 1.5 months at 100° C.

With more diffusion, the wire becomes more and more brittle and looks like the one shown in FIG. 6-lead plated gold wire after 57 days at 100° C., magnification 307×. Such wire fractures under a negligible stress. The fracture surface is shown in FIG. 7-lead plated gold wire after 1.5 months at 100° C., magnification 749×. One can see the original wire diameter contour now filled with large grains of gold-lead intermetallic.

The intermetallic formation is confirmed by DSC (differential scanning colorimeter) experiment. The transition peak found to be at 255.6° C. obviously corresponds to peritectic transformation as is known from the Au-Pb phase diagram FIG. 10B.

Figure 8:
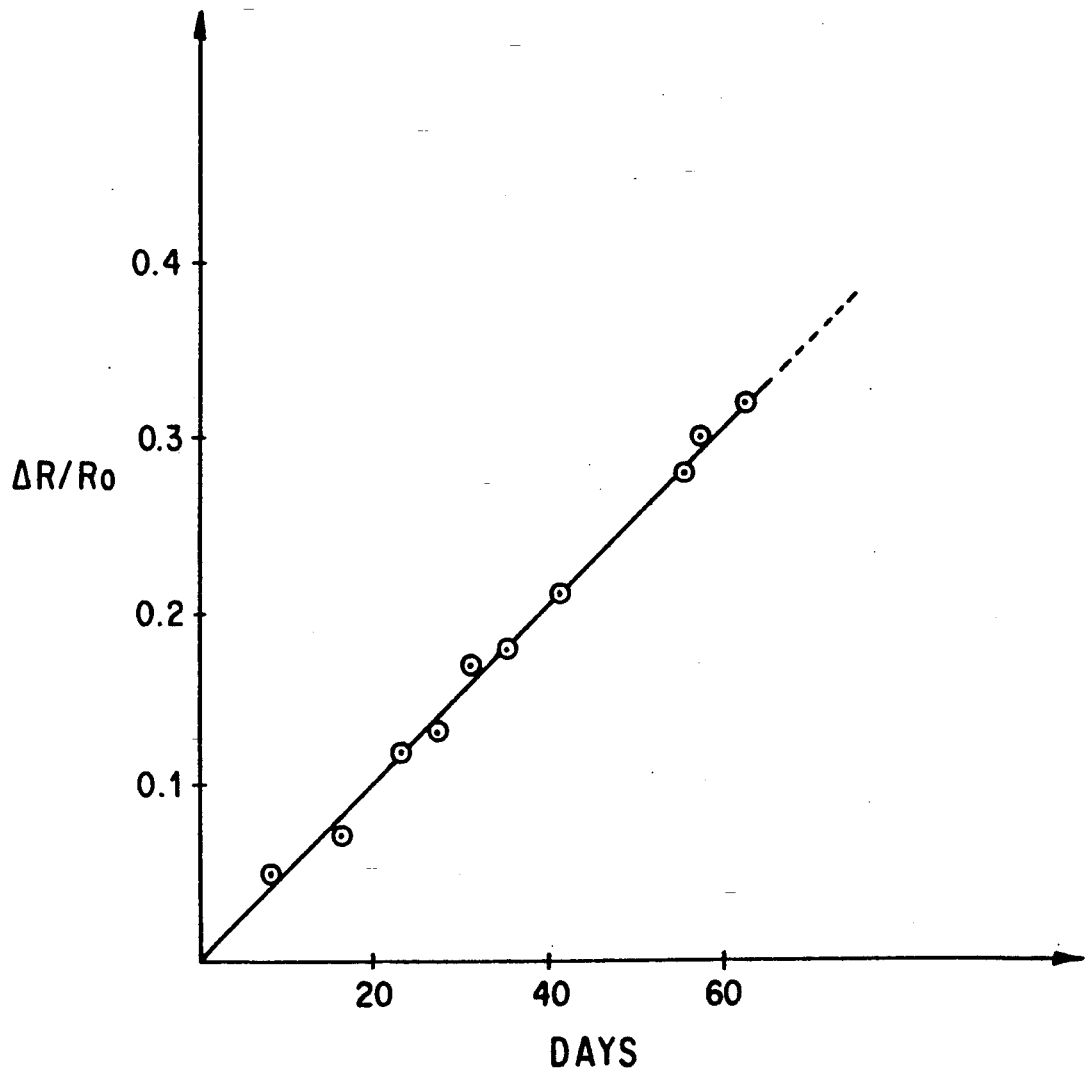
FIG. 8 is a graph illustrating the linear relationship between the resistivity of a wire similar to that of FIG. 6 and the passage of time at 100° C.

FIG. 8 shows a linear relative change in the resistance of such wire with time at 100° C., where $R_0$ is initial resistance of lead plated wire, and $\Delta R$ is an absolute change of resistance with time. For example, after 20 days $\Delta R/R_0=0.1$ which means that the resistance of thwe wire is 1.10 times the initial resistance $R_0$.

EXAMPLE 2 GALLIUM—GOLD SYSTEM

Figure 9:
FIG. 9 is a copy of a photograph showing the cross-section of the fracture surface after 17 hours at 60° C. of 30 micron diameter gold wire having gallium liquid phase deposited thereon.

Since Gallium melts at 28° C., the liquid phase deposition from the melt was applied to coat gold wire. A ceramic bonding capillary with a small heater was used for this purpose. Gallium was put on the surface of 1.2 mil wire in a shape of a small ball. Such wire was placed into an oven at 100° C. Due to surface diffusion, the gallium ball spread along the wire surface and gallium diffused into the gold. In 17 hours, the fracture occurred as shown in FIG. 9 at 307× magnification.

EXAMPLE 3 GALLIUM—INDIUM—GOLD SYSTEM

Figure 10A:
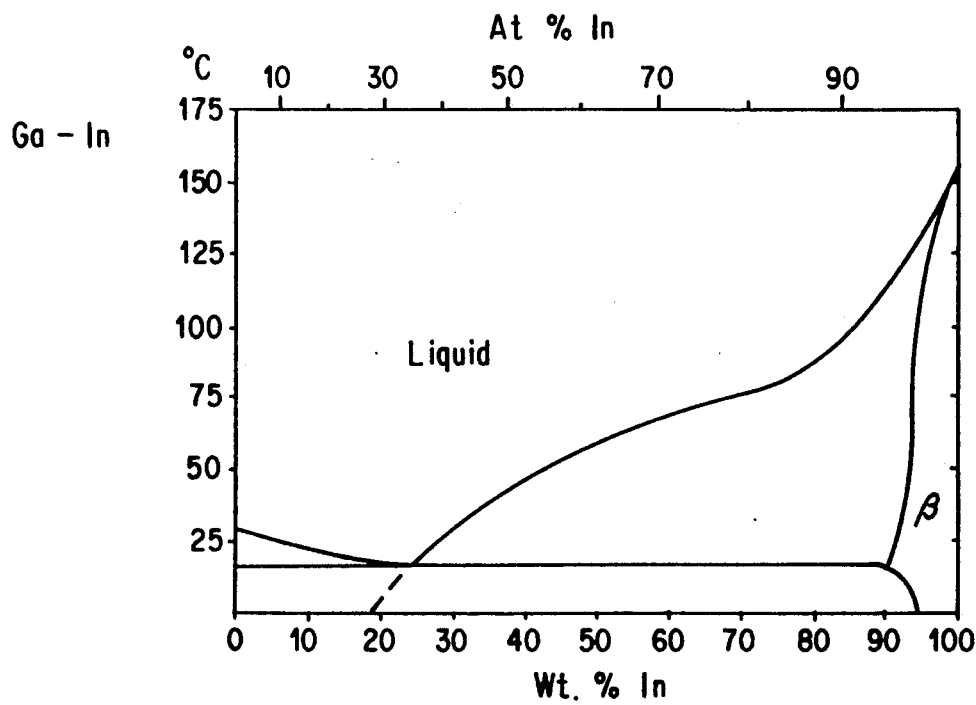
FIG. 10A is the phase diagram for gallium-indium.
Figure 10B:
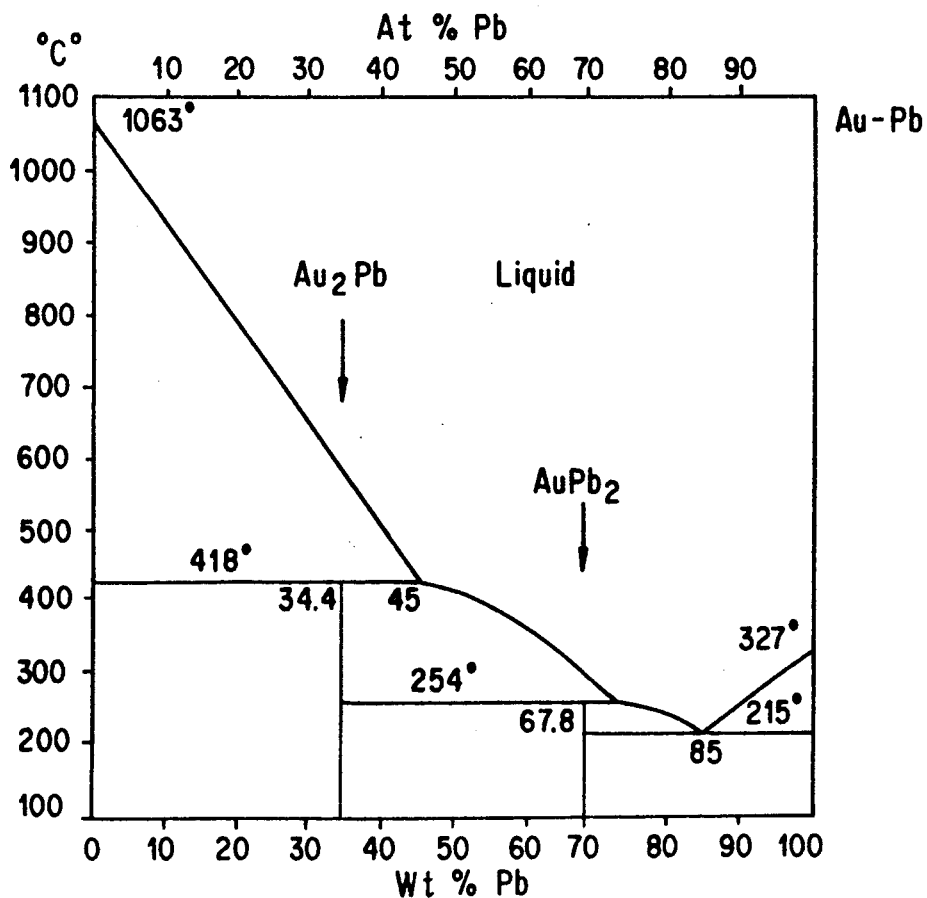
FIG. 10B is the phase diagram for gold-lead.
Figure 11:
FIG. 11 is a copy of a photograph showing the cross-section of the fracture surface after 700 hours at 100° C. of 30 micron diameter gold wire having indium-gallium liquid phase deposited thereon.

FIG. 10A shows the gallium-indium phase diagram. Gallium-indium eutectic (melts at 15° C.) was applied on the gold wire surface in the same manner as pure gallium. The fractures occurred after 700 hours at 100° C. as shown in FIG. 11, magnification 617×.

Figure 12:
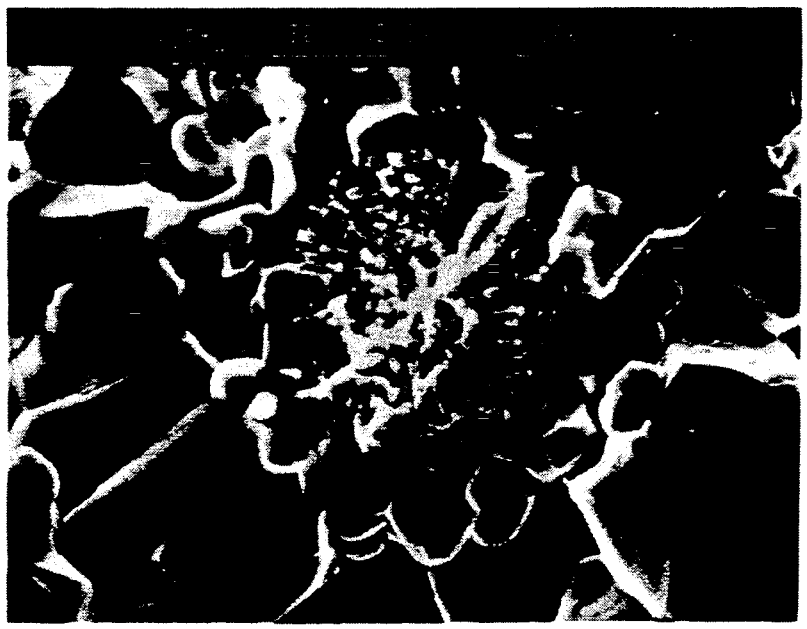
FIG. 12 is a copy of a photograph showing the cross-section of the fracture surface after 3 weeks at 100° C. of 30 micron diameter gold wire having a 20% gallium/80% indium liquid phase deposited thereon.

Such a fast diffusion slows down significantly with increasing indium content in gallium-indium system. FIG. 12 shows the fracture surface after 3 weeks at 100° C. of gold wire with a 20 part gallium to 80 part indium coating, magnification 2,540×. Even below 100° C., such coating contains some eutectic.

Figure 13:
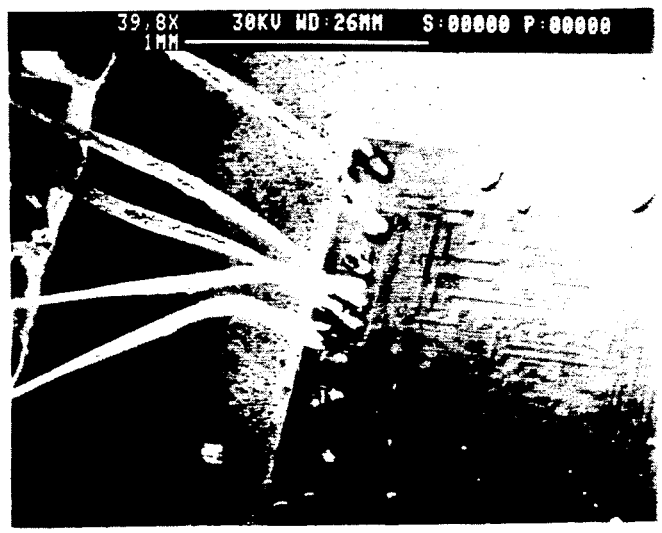
FIG. 13 is a copy of a photograph after 3 days at 100° C. of an integrated circuit having gold wires such as those of FIG. 9 providing connections.
Figure 14:
FIG. 14 is an alternate view of the view of FIG. 13.
Figure 15:
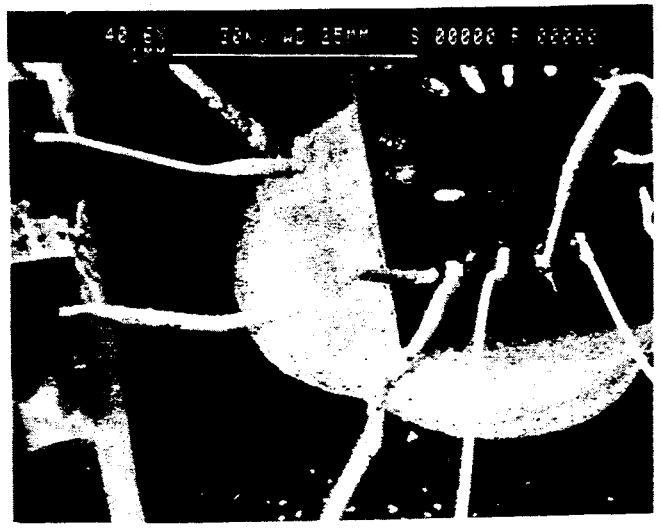
FIG. 15 is a copy of a photograph after 4 weeks at 100° C. of an integrated circuit having gold wires such as those of FIG. 12 providing connections.

FIGS. 13, 14 and 15 show the actual integrated circuit (IC) with gold bonding wires that were coated with different materials described below. All breaks had occurred in the stressed regions of the wire as anticipated.

In all of the foregoing discussion the material 24 was being plated onto the gold wire 22 to make the device 20. It should be clear that it is equally possible to plate gold or gold alloys onto the material. The material will similarly diffuse outwardly into the gold and form intermetallics. Such a device can also be used in the same manner to fuse circuits. The behavior and the fusing characteristics are similar to the characteristics of the device 20. Clearly, from a performance standpoint it makes little difference if the gold or gold alloy is plated upon or is the metal being plated.

The present invention is not to be restricted in form nor limited in scope except by the claims appended hereto:

What we claim is:

1. An article of manufacture comprising: a soft metal wire made from a plurality of soft metal wire segments in end-to-end connection whereby each soft metal wire segment has a predetermined length having deposited thereon, or contained within, a metal or metal alloy which diffuses into or diffuses throughout the soft metal which metal or metal alloy deposited thereon or contained within causes a controlled time temperature embrittlement of the soft metal wire segment and said soft metal is selected from the group consisting of gold, copper, silver and palladium.

2. An article of manufacture comprising: a soft metal article having a predetermined cross section geometry and length and a predetermined resistivity made from a plurality of soft metal segments in end-to-end connection whereby each soft metal segment has a predetermined length, at least one of said segments created by having deposited on said soft metal article, or contained within said soft metal article, a metal or metal alloy which diffuses into or diffuses from within outwardly of said soft metal which metal or metal alloy deposited thereon or contained within causes a controlled time temperature embrittlement of said at least one soft metal segment, said metal or metal alloy is selected from the group consisting of lead, indium, mercury, gallium, tin, bismuth, and alloys containing these metals and said soft metal is selected from the group consisting of gold, copper, silver and palladium.

3. The article of manufacture according to claim 2 wherein said predetermined cross section geometry is selected from the group consisting of; a circle, a rectangle and an ellipse.

* * * * *